United States Patent
Fukano et al.

(10) Patent No.: US 8,384,272 B2
(45) Date of Patent: Feb. 26, 2013

(54) ACOUSTIC WAVE DEVICE AND METHOD FOR PRODUCTION OF SAME

(75) Inventors: Toru Fukano, Kyoto (JP); Yoshihiro Ookubo, Kyoto (JP); Junya Nishii, Kyoto (JP)

(73) Assignee: Kyocera Corporation, Kyoto (JP)

( * ) Notice: Subject to any disclaimer, the term of this patent is extended or adjusted under 35 U.S.C. 154(b) by 49 days.

(21) Appl. No.: 12/865,369

(22) PCT Filed: Jan. 30, 2009

(86) PCT No.: PCT/JP2009/051657
§ 371 (c)(1),
(2), (4) Date: Oct. 14, 2010

(87) PCT Pub. No.: WO2009/096563
PCT Pub. Date: Aug. 6, 2009

(65) Prior Publication Data
US 2011/0018389 A1   Jan. 27, 2011

(30) Foreign Application Priority Data

Jan. 30, 2008   (JP) .................................. 2008-019037

(51) Int. Cl.
*H01L 41/08* (2006.01)

(52) U.S. Cl. .................................... 310/344; 310/313 R

(58) Field of Classification Search .................. 310/344, 310/348
See application file for complete search history.

(56) References Cited

U.S. PATENT DOCUMENTS

| | | | | |
|---|---|---|---|---|
| 7,205,705 B2* | 4/2007 | Iwamoto | | 310/340 |
| 7,239,068 B2* | 7/2007 | Miyaji | | 310/340 |
| 7,259,500 B2* | 8/2007 | Iwamoto et al. | | 310/340 |
| 7,304,417 B2* | 12/2007 | Masuko et al. | | 310/344 |
| 7,427,824 B2* | 9/2008 | Iwamoto et al. | | 310/344 |
| 7,629,729 B2* | 12/2009 | Inoue et al. | | 310/348 |
| 2002/0101304 A1 | 8/2002 | Onishi et al. | | 333/193 |
| 2004/0125970 A1 | 7/2004 | Kawakubo | | 381/190 |

FOREIGN PATENT DOCUMENTS

| | | |
|---|---|---|
| JP | 62-163347 | 7/1987 |
| JP | 2001185976 A | 7/2001 |
| JP | 2002-261582 | 9/2002 |
| JP | 2003188514 A | 7/2003 |
| JP | 2004-222244 | 8/2004 |
| JP | 2005033689 A | 2/2005 |
| JP | 2006217226 A | 8/2006 |

(Continued)

OTHER PUBLICATIONS

Japanese language office action dated May 22, 2012 and its English language translation issued in corresponding Japanese application 2009551625.

*Primary Examiner* — Mark Budd
(74) *Attorney, Agent, or Firm* — DLA Piper LLP (US)

(57) ABSTRACT

A small and highly reliable acoustic wave device and a method for production of the same will be provided. The acoustic wave device has a piezoelectric substrate 1; a SAW element 2 on one main surface of the piezoelectric substrate 1; an outside connection-use conductor 3 formed on the one main surface of the piezoelectric substrate 1 and electrically connected to the SAW element 2; a columnar electrode 10 on the outside connection-use conductor 3; and a protective cover 6 defining inner walls of a vibration space 7 for vibration of the SAW element 2 and planarly surrounding a side surface of the columnar electrode 10.

9 Claims, 9 Drawing Sheets

FOREIGN PATENT DOCUMENTS

| | | |
|---|---|---|
| JP | 2006324894 A | 11/2006 |
| JP | 2006352430 A | 12/2006 |
| JP | 2007006110 A | 1/2007 |
| JP | 2007-266865 | 10/2007 |
| JP | 2007281902 A | 10/2007 |
| JP | 2007-324162 | 12/2007 |
| JP | 2007-325013 | 12/2007 |
| JP | 2008153957 A | 7/2008 |
| JP | 2009124378 A | 6/2009 |
| WO | WO 2008/081935 A1 | 7/2008 |

* cited by examiner

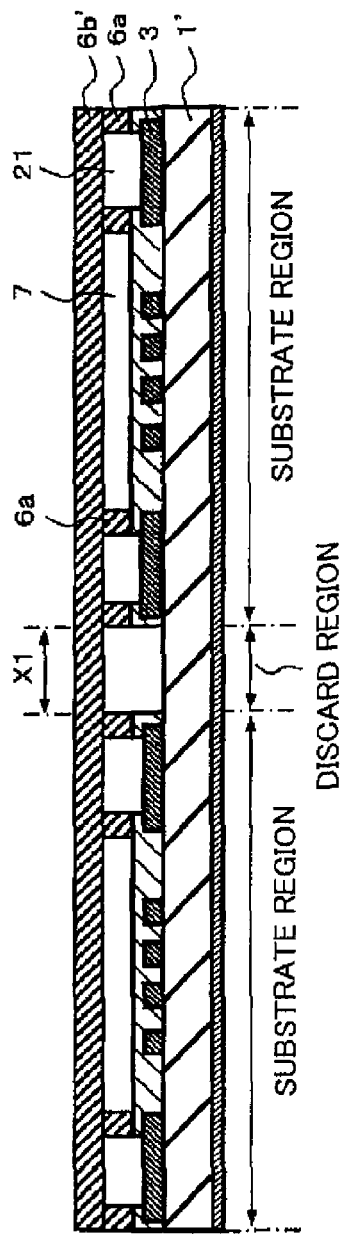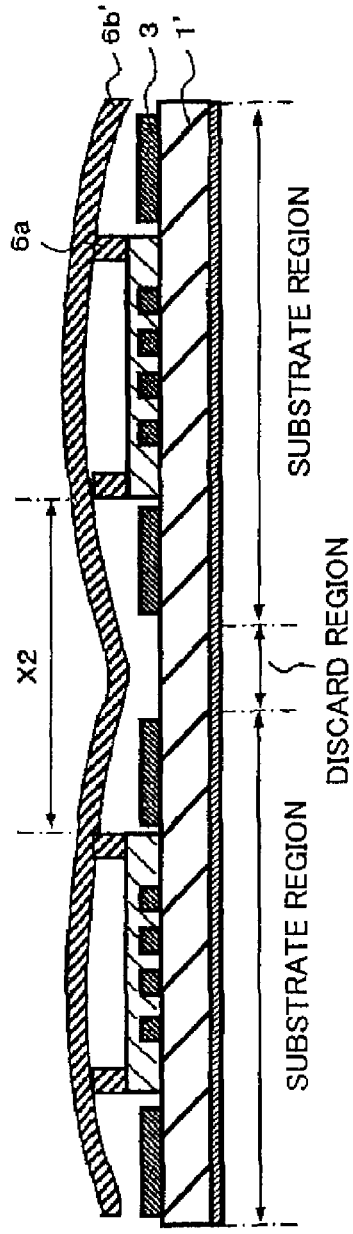

US 8,384,272 B2

ACOUSTIC WAVE DEVICE AND METHOD FOR PRODUCTION OF SAME

CROSS-REFERENCE TO THE RELATED APPLICATIONS

This application is a national stage of international application No. PCT/JP2009/051657, filed on Jan. 30, 2009, and claims the benefit of priority under 35 USC 119 to Japanese Patent Application No. 2008-019037, filed on Jan. 30, 2008, the entire contents of which are incorporated herein by reference.

TECHNICAL FIELD

The present invention relates to an acoustic wave device mainly used in a wireless communication circuit of a mobile communication device etc. and a method for production of the same. The acoustic wave device relates to, for example, a surface acoustic wave (hereinafter, sometimes abbreviated as "SAW") device and a thin film bulk acoustic resonator.

BACKGROUND ART

In recent years, portable terminals used for mobile communication have been increasingly reduced in size and lightened in weight. Along with this, the portable terminals are being made multi-banded to be able to handle a plurality of communication systems and are being given more functions. Therefore, the built-in circuits have increased. For this reason, it is strongly demanded that the electronic parts used in the terminals become surface mount parts or small-size parts for improvement of their mounting density.

SAW devices have been known as key parts of portable terminals. A SAW device usually has a configuration where a sealed hollow portion which becomes a vibration space is secured in the vicinity of an electrode surface at which the SAW is excited. For such SAW devices as well, surface mountable small-size parts are being demanded.

With respect to such demands, a surface mount type SAW device as shown in FIG. 9 is proposed. The SAW device shown in FIG. 9 has a protective cover 32 having a frame member 32a surrounding a SAW element 31 on a piezoelectric substrate 30, thereby secures a vibration space 33 of the SAW element 31.

Further, on the main surface of the piezoelectric substrate 30 in the vicinity of the frame member 32a of the protective cover 32, columnar electrodes 34 electrically connected to the SAW element 31 are provided. The columnar electrodes 34 are provided in order to guide electric signals of the SAW element 31 to an external circuit or introduce electric signals to the SAW element 31 from the outside. The columnar electrodes 34 are sealed by a sealing resin 35 molded around them. This sealing resin 35 prevents breakage of the columnar electrodes 34 when shock is applied from the outside when mounting or using the SAW device (see, for example, Patent Document 1, FIG. 22 to FIG. 24).

In the SAW device shown in FIG. 9, however, voids 36 such as air bubbles or the like easily form around the columnar electrodes 34 for the reason that the resin is not sufficiently filled in the clearance between the protective cover 32 and the columnar electrodes 34. Thus the support strength of the columnar electrodes 34 falls, and the columnar electrodes 34 break more easily at the time of mounting etc. of the SAW device. As a result, a drop in the reliability of the SAW device is invited because connection failure etc. easily occur when the columnar electrodes 34 break.

Further, in the case of the SAW device shown in FIG. 9, a contact area of the frame member 32a and the piezoelectric substrate 30 is small, and a bonding force of the protective cover 32 and the piezoelectric substrate 30 is relatively weak. Accordingly, when stress due to a difference of coefficients of thermal expansion between the sealing resin 35 and the protective cover 32 or the like is added to the protective cover 32, the protective cover 32 easily peels off from the piezoelectric substrate 30. As a result, a drop in the reliability of the SAW device is invited.

Above, a SAW device was exemplified as the acoustic wave device, but other acoustic wave devices, for example, thin film bulk acoustic resonators, also encounter problems similar to those described above.

Patent Document 1: Japanese Patent Publication (A) No. 2007-325013

DISCLOSURE OF THE INVENTION

Problem to be Solved by the Invention

Accordingly, provision of an acoustic wave device excellent in reliability and a method for production of same has been demanded.

Means for Solving the Problem

To solve the above problems, an acoustic wave device according to an embodiment of the present invention has a substrate; an acoustic wave element on one main surface of the substrate; an outside connection-use conductor on the one main surface of the substrate, electrically connected to the acoustic wave element; a columnar electrode on the outside connection-use conductor; and a protective cover defining inner walls of a vibration space for vibration of the acoustic wave element and planarly surrounding a side surface of the columnar electrode.

Further, a method for production of an acoustic wave device according to an embodiment of the present invention includes a step of preparing an element formation substrate having a substrate, an acoustic wave element on one main surface of the substrate, and an outside connection-use conductor formed on the one main surface of the substrate and electrically connected to the acoustic wave element; a step of forming a protective cover defining inner walls of a vibration space on the acoustic wave element and having an electrode formation-use through hole which exposes a top surface of the outside connection-use conductor; and a step of forming a columnar electrode in the electrode formation-use through hole.

Further, a method for production of an acoustic wave device according to an embodiment of the present invention includes a base substrate preparation step of preparing a base substrate having a plurality of substrate regions each corresponding to an element formation substrate provided with a substrate, an acoustic wave element on one main surface of the substrate, and an outside connection-use conductor formed on the one main surface of the substrate and electrically connected to the acoustic wave element; a protective cover member formation step of forming, on the base substrate, a first layer having openings which become vibration spaces of the acoustic wave elements and electrode formation-use through holes which exposes top surfaces of the outside connection-use conductors and forming a second layer stacked on the first layer to close the openings; a columnar electrode step of forming columnar electrodes in the electrode formation-use through holes; and a division step of dividing the base substrate into individual substrate regions, forming a plurality of frame members by the first layer, and forming a plurality of lid members closing the openings by the second layer.

According to the above acoustic wave device and production methods of the acoustic wave device, the side surface of the columnar electrode is covered by the frame member of the protective cover configuring the inner walls of the vibration space for facilitating vibration of the acoustic wave element, therefore voids which may be formed at the periphery of the columnar electrode can be reduced. Thus breakage of the columnar electrode becomes harder to occur, so a small-sized and highly reliable acoustic wave device can be realized. Further, the frame member extends up to the periphery of the columnar electrode, therefore the contact area between the substrate and the frame member can be increased without enlarging the substrate, and the bonding force between the substrate and the protective cover can be improved. Accordingly, the vibration space can stably keep the tight seal, and a small-sized and highly reliable acoustic wave device can be formed.

BRIEF DESCRIPTION OF THE DRAWINGS

FIG. 1 Views schematically showing a SAW device according to an embodiment of the present invention, in which

FIG. 4 Views schematically showing an example of a production method of the SAW device shown in FIG. 1.

DESCRIPTION OF NOTATIONS

Figure 1A:
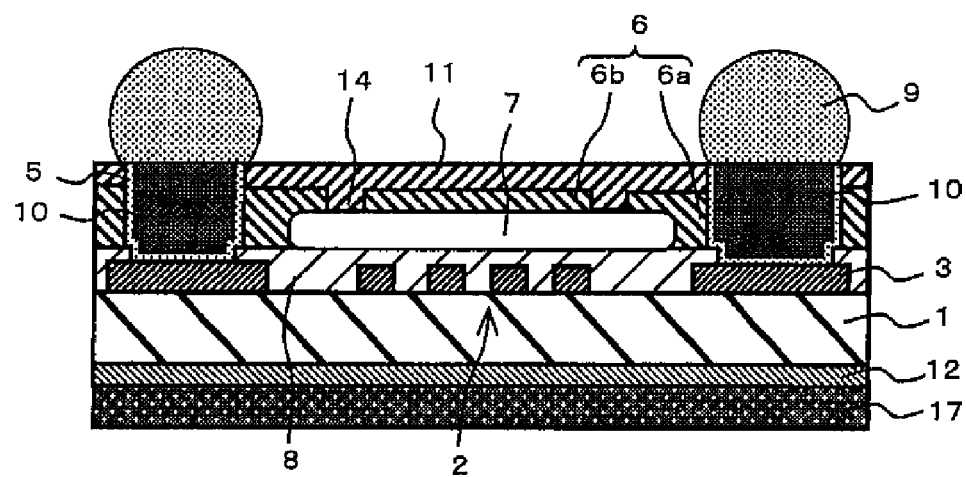
FIG. 1A is a cross-sectional view of the SAW device.

1 . . . piezoelectric substrate
2 . . . SAW element
3 . . . connection-use conductor
4 . . . line conductor
5 . . . electrode formation base layer
6 . . . protective cover
6a . . . frame member
6b . . . lid member
7 . . . vibration space
8 . . . protective film
9 . . . electrode terminal
10 . . . columnar electrode

BEST MODE FOR CARRYING OUT THE INVENTION

Below, preferred embodiments of the acoustic wave device and the method for production of the acoustic wave device according to the present invention are explained in detail with reference to the drawings. Note that, views used in the following embodiments are schematic views, and dimensional ratios of the figures do not necessarily coincide with the actual ratios. Further, the present invention is not limited to the following embodiments. Various modifications, enhancements, and so on are possible within a range not out of the gist of the present invention.

SAW Device

Figure 1B:
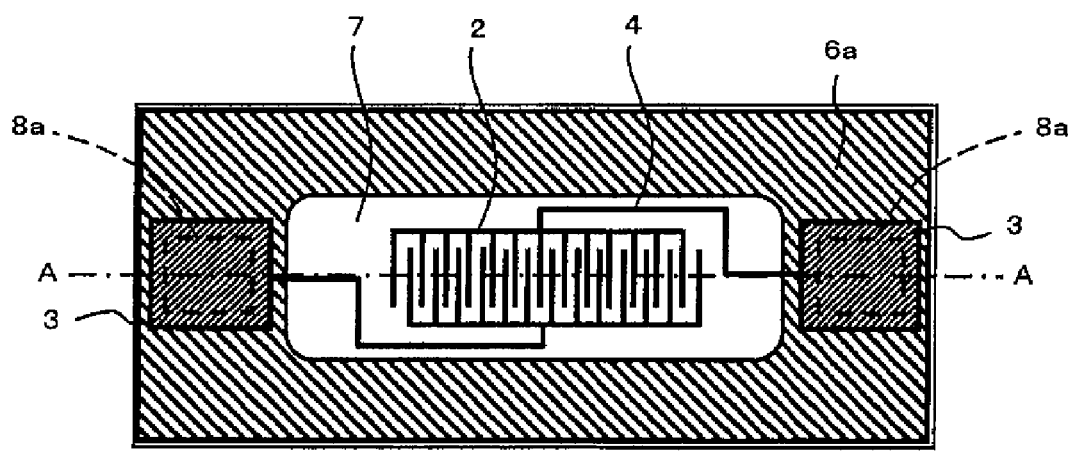
FIG. 1B is a view showing the planar arrangement relationships of parts of the SAW device.

A SAW device according to the present embodiment is, as shown in FIG. 1A and FIG. 1B, mainly configured by a piezoelectric substrate 1, SAW element 2, connection-use conductors 3, protective cover 6, and columnar electrodes 10. Note that, due to the convenience of illustration, the numbers of comb-shaped electrodes do not coincide between FIG. 1A and FIG. 1B. Note that, FIG. 1B is a view for assisting understanding of the relative arrangement and is not necessarily viewed as shown in FIG. 1B when viewing the SAW device from the top.

The piezoelectric substrate 1 is for example a single crystal substrate having a piezoelectric property such as a lithium tantalite single crystal, a lithium niobate single crystal and so on. The single crystal substrate is formed to various shapes, for example, a flat plate shape or box shape.

The SAW element 2 is formed on one main surface (hereinafter, simply referred to as a top surface) of the piezoelectric substrate 1 and includes several pairs of comb-shaped (interdigital) electrodes each having a plurality of electrode fingers extending in a direction perpendicular to the SAW propagation direction of the piezoelectric substrate 1. The comb-shaped electrodes are formed so that their electrode fingers mesh with each other.

The SAW element 2 is formed by for example an Al alloy such as an Al—Cu alloy or the like. FIG. 1A and FIG. 1B show a case where one SAW element is provided. However, a ladder type SAW filter, a double mode SAW resonator filter or the like may be configured by connecting a plurality of SAW elements 2 by series connection, parallel connection, or other connection. Note that, not shown reflectors having comb-shaped electrodes configured by a plurality of electrode fingers extending in a direction perpendicular to the SAW propagation direction of the piezoelectric substrate 1 are provided at the two ends of the SAW element 2. However, in the following description, the reflectors will be included in what is referred to as the SAW element.

The SAW element 2 is covered by a protective film 8. The protective film 8 is made of a material which has an insulation property and is light enough in weight to an extent where it does not exert an influence upon a SAW element 2 propagating SAW, for example, silicon oxide, silicon nitride, and silicon. By covering the SAW element 2 by the protective film 8 in this way, oxidation etc. of the comb-shaped electrode configuring the SAW element 2 can be prevented.

The outside connection-use conductors 3 are connected through the line conductor 4 formed on the piezoelectric substrate 1 to the SAW element 2. The outside connection-use conductors 3 are formed for example in approximately rectangular shapes by an Al alloy such as an Al—Cu alloy or the like. In the present embodiment, two outside connection-use conductors 3 are provided. One is an outside connection-use conductor for input signals, and the other is an outside connection-use conductor for output signals.

The columnar electrodes 10 are installed upright on the top surfaces of the outside connection-use conductors 3. The columnar electrodes 10 are provided for guiding electric signals of the SAW element 2 to an external circuit or introducing electric signals into the SAW element 2 from the outside.

The columnar electrodes 10 are formed for example in quadrangular prism columnar shapes so that their top surfaces becomes higher than the top surface of the later explained protective cover 6. Specifically, the heights of the columnar electrodes 10 (heights from the top surfaces of the outside connection-use conductors 3) are set to, for example, 10 μm to 150 μm. Note that, the columnar electrodes 10 are formed by using conductive material such as solder, Cu, Au, Ni, or the like by electroplating, electroless plating, the stud bump method, or the like. The cross-sectional shapes of the columnar electrodes 10 are not limited to quadrangular prism. The cross-sectional shapes may be any of shapes as long as the columnar electrodes 10 are columns, for example circular column and triangular prisms.

The side surfaces of such columnar electrodes 10 are covered by the frame member 6a of the protective cover 6.

The protective cover 6 is configured by the frame member 6a surrounding the SAW element 2 in a plan view and a lid member 6b arranged on the frame member 6a so as to close the opening surface of the frame member 6a.

The protective cover 6 is provided in order to secure the vibration space 7 of the comb-shaped electrodes configuring the SAW element 2. Specifically, a space surrounded by the frame member 6a, the lid member 6b, and the top surface of the piezoelectric substrate 1 becomes the vibration space 7.

The frame member 6a forms the inner walls of the vibration space 7, and the lid member 6b forms the ceiling of the vibration space 7. In the frame member 6a, the portion surrounding the SAW element 2 and the portion covering the side surfaces of the columnar electrodes 10 are integrally formed.

In the SAW device according to the present embodiment, the side surfaces of the columnar electrodes 10 are covered by the frame member 6a of the protective cover 6 as explained above. Namely, the member for securing the vibration space 7 and the member protecting the columnar electrodes 10 are made of the same material and form a structure where voids such as air bubbles or the like are hard to form around the columnar electrodes 10. Thus the columnar electrodes 10 are covered in a good state, and a highly reliable SAW device that breakage of the columnar electrodes 10 is reduced can be formed.

Further, since the frame member 6a is extended up to the periphery of the columnar electrodes 10, the SAW device of the present embodiment can increase the contact area between the piezoelectric substrate 1 and the frame member 6a while keeping the piezoelectric substrate 1 small in size and can improve the contact force between the piezoelectric substrate 1 and the protective cover 6. Accordingly, the tight seal of the vibration space 7 can be stably maintained, and a small-sized and highly reliable SAW device can be formed.

In particular, if the frame member 6a is formed so that the end surface along the outer periphery of the frame member 6a and the end surface along the outer periphery of the piezoelectric substrate 1 are located on the same plane, in other words, so that the outer circumferential edge of the frame member 6a and the outer circumferential edge of the piezoelectric substrate 1 coincide in a plan view, the contact area between the frame member 6a and the piezoelectric substrate (the protective film 8 in the case of the present embodiment) can be further increased, and it becomes possible to strongly attach the frame member 6a on the piezoelectric substrate 1.

The vibration space 7, as shown in FIG. 1B, is formed so that the shape in a plan view is approximately rectangular. The corner portions are rounded. Further, as shown in FIG. 1A, in a vertical cross-section of the vibration space 7, the corner portions on the lid member 6b side and the corner portions on the piezoelectric substrate 1 side are rounded as well. In this way, by rounding portions which become the corner portions of the vibration space 7 in this way, portions to which stress is apt to be concentrated are reduced. Therefore, occurrence of cracks etc. in the protective cover 6 can be suppressed, and the tight seal of the vibration space 7 can be held in a good state for a long period of time.

The frame member 6a and the lid member 6b configuring the protective cover 6 are formed by, for example a negative-type photocurable resist or other material such as an epoxy-based resin, polyimide resin, BCB (benzocyclobutene), acrylic resin or the like.

When the protective cover 6 is formed by a photocurable resin material, generally an acid generating material containing fluorine is contained in the photocurable resin material in order to manifest the photosensitivity. However, in the process of preparation of the protective cover 6, when light is irradiated on the photocurable resin material forming the protective cover 6, the fluorine given to the acid generating material is sometimes released. If the released fluorine remains in the vibration space 7, the comb-shaped electrodes configuring the SAW element 2 are liable to be damaged by the residual fluorine gas and the electrical characteristics of the SAW device are liable to deteriorate. In order to prevent such deterioration of characteristics of the SAW device due to such residual fluorine gas, preferably a through hole 14 is provided in the protective cover 6. By providing the through hole 14, a route for escape of fluorine released from the photocurable resin is formed, therefore the amount of the fluorine gas which remains in the vibration space 7 can be reduced, and the electrical characteristics of the SAW device can be maintained in a good state. Further, by providing the through hole 14, there also exists the advantage that cleaning of the internal portion of the vibration space 7 becomes possible even after formation of the protective cover 6. Note that, preferably two or more through holes 14 are provided. This is because by providing two or more through holes 14, escape of the fluorine gas becomes easier and cleaning of the internal portion of the protective cover becomes easier.

Note that, the acid generating material is a substance reacting to light or heat and generating protons ($H^+$). As the acid generating material, there can be mentioned as an example triarylsulfonium hexafluoroantimonate, benzoin tosylate, benzoin mesylate, pyrogallol tritosylate, pyrogallol trimesylate, tri(nitrobenzyl)phosphate, trianisoline phosphate, diaryl iodonium salt, triaryl sulfonium salt, or the like.

Further, in case the protective cover 6 is made of a photocurable resin material containing an acid generating material, preferably the protective cover 6 and the outside connection-use conductors 3 are separated from each other. For example, as shown in FIG. 1A and FIG. 1B, by extending the protective film 8 provided in order to cover the comb-shaped electrodes from the region forming the comb-shaped electrodes to the region forming the outside connection-use conductors 3 and covering the portion other than the center region (region surrounded by a dotted line in FIG. 1B) of the outside connection-use conductors 3 by the extended portion, the protective film 8 is interposed between the bottom surface of the protective cover 6 and the top surface of the outside connection-use conductors 3.

Accordingly, when forming the protective cover 6, even if the protons generated from the acid generating material at the time of exposure try to invade the metal forming the outside connection-use conductors 3, such invasion is reduced well by the protective film 8, so a good cross-linking reaction of molecules in the resin material forming the protective cover 6 will occur. As a result, the resin material cures well, and the protective cover 6 will closely adhere to the protective film 8.

Thus the tight seal of the vibration space 7 is secured, and the electrical characteristics of the SAW device can be maintained in a good state.

Further, the SAW device according to the present embodiment is provided with the sealing resin 11 covering the protective cover 6 and closing the through holes 14. Further, the sealing resin 11 covers the side surfaces of the portions of the columnar electrodes 10 projecting from the frame member 6a as well. The sealing resin 11 is preferably formed by using an epoxy-based resin which can be adjusted in coefficient of thermal expansion to become almost equal to that of the piezoelectric substrate 1 by mixing in a filler and is excellent in chemical resistance as well or another material having a low elasticity. This is for suppressing the stress added to the piezoelectric substrate 1 as much as possible.

Further, in the SAW device according to the present embodiment, a back surface electrode 12 is provided on the main surface located on the back side of the main surface of the piezoelectric substrate 1 (hereinafter, simply referred to as the "bottom surface"). The back surface electrode 12 is made of for example an Al alloy such as an Al—Cu alloy or the like. By providing the back surface electrode 12, electric charges charged at the surface of the piezoelectric substrate 1 due to a temperature change can be grounded, therefore occurrence of breakage in the piezoelectric substrate 1 due to sparks etc., occurrence of sparks between electrode fingers of the comb-shaped electrodes configuring the SAW element 2, and so on can be prevented. Note that, the back surface electrode 12 is preferably provided on the entire bottom surface of the piezoelectric substrate 1 as in the present embodiment.

As explained above, in the SAW device according to the present embodiment, the side surfaces of the columnar electrodes 10 are covered by the frame member 6a of the protective cover 6 surrounding the SAW element 2 in a plan view, therefore voids which may be formed around the columnar electrodes 10 can be reduced. Accordingly breakage of the columnar electrodes 10 becomes harder to occur, and a small-sized and highly reliable SAW device can be realized.

Method of Production of SAW Device

Next, production processes of the SAW device according to the present embodiment will be explained by using FIG. 2 to FIG. 7.

Step A

First, an element formation substrate 20 having a piezoelectric substrate 1, a SAW element 2 on one main surface of the piezoelectric substrate 1, and outside connection-use conductors 3 which are formed on the one main surface of the piezoelectric substrate 1 and are electrically connected to the SAW element 2 is prepared (FIG. 2).

Figure 2A:
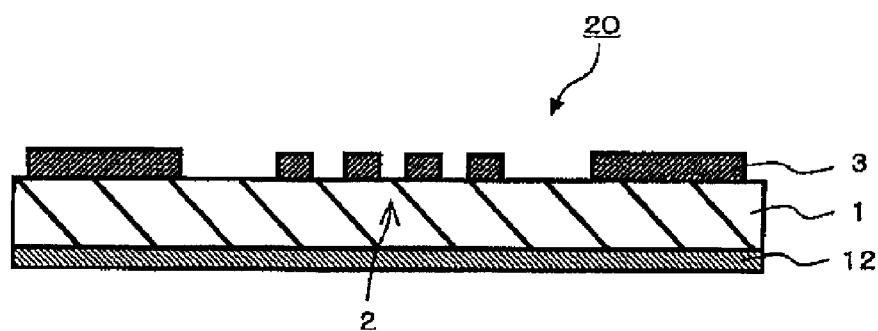
FIG. 2 Views schematically showing an example of a production method of the SAW device shown in FIG. 1.

For manufacturing the element formation substrate 20, first, as shown in FIG. 2A, a SAW element 2, outside connection-use conductors 3, and an line conductor 4 are formed on the top surface of the piezoelectric substrate 1. Specifically, a single crystal substrate having a piezoelectric property such as a lithium tantalite single crystal, a lithium niobate single crystal or the like is used as the piezoelectric substrate 1, and the comb-shaped electrodes configuring the SAW element 2, outside connection-use conductors 3, and line conductor 4 are formed by an Al alloy such as an Al—Cu alloy or the like on its one main surface. The comb-shaped electrodes, outside connection-use conductors 3, and line conductor 4 are formed out by forming a thin Al alloy film by thin film forming method such as sputtering, vapor deposition, CVD (chemical vapor deposition) or the like and patterning the thin Al alloy film to desired shapes by photolithography using a reduced projection exposure apparatus (stepper) and RIE (reactive ion etching) apparatus or the like.

Then, by thin film forming method such as sputtering, vapor deposition, CVD (chemical vapor deposition) or the like, the back surface electrode 12 made of Al alloy such as Al—Cu alloy or the like is formed on the back surface of the piezoelectric substrate 1.

Figure 2B:
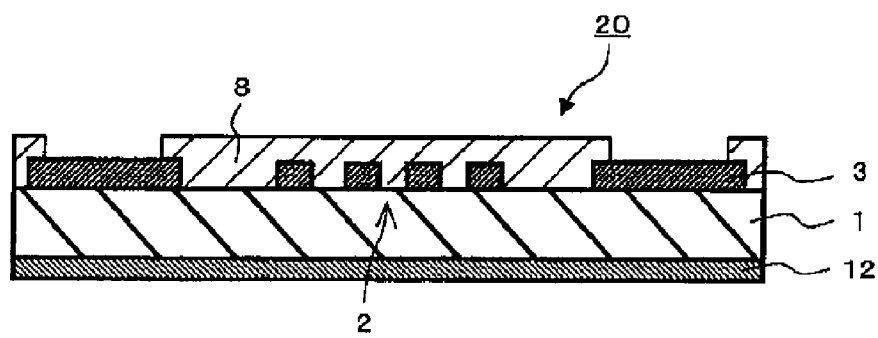

Next, as shown in FIG. 2B, a protective film 8 made of silicon oxide, silicon nitride, silicon, or the like is formed. Specifically, a thin film made of silicon oxide, silicon nitride, or silicon is formed by thin film forming method such as CVD, vapor deposition or the like so as to cover at least the tops of the comb-shaped electrodes, line conductor 4, and outside connection-use conductors 3, then a portion thereof is removed by photolithography so that the top surfaces of the outside connection-use conductors 3 are exposed, to thereby form the protective film 8.

Step B

Figure 3A:
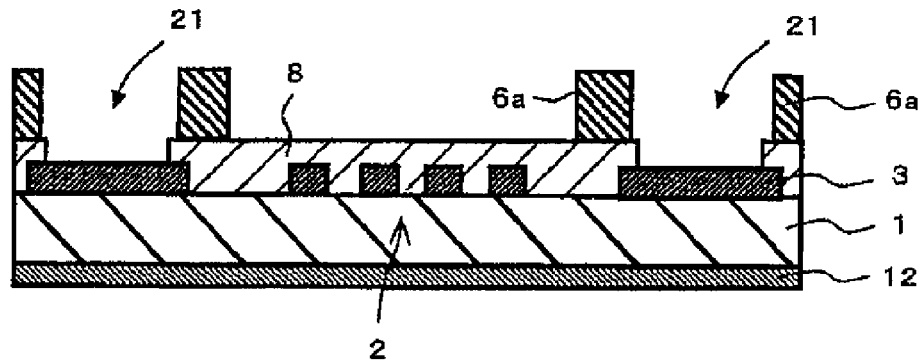
FIG. 3 Views schematically showing an example of a production method of the SAW device shown in FIG. 1.
Figure 3B:
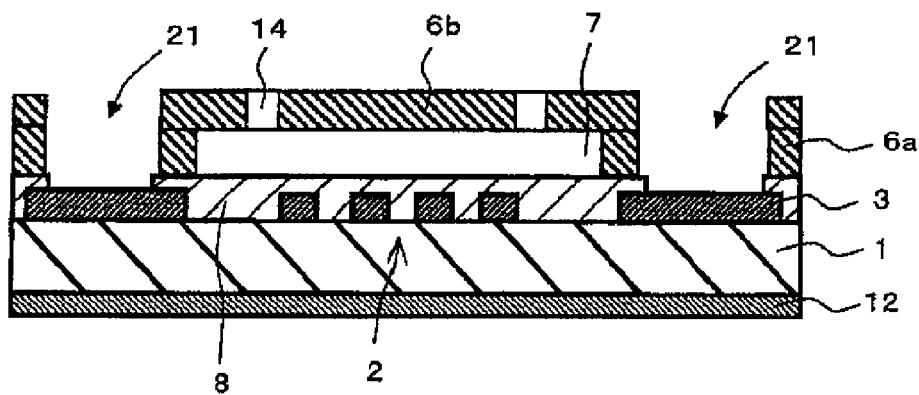
Figure 3C:
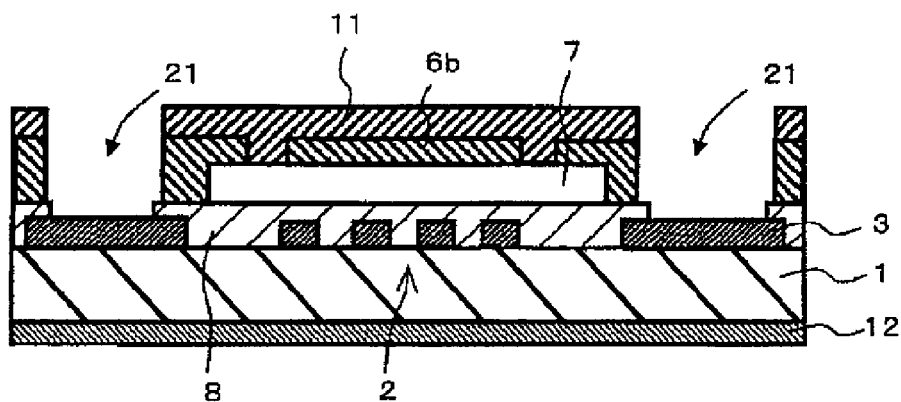

Next, a frame member 6a having electrode formation-use through-holes 21 for exposing the top surface of the outside connection-use conductors 3 and surrounding the SAW element 2 is formed (FIG. 3A, FIG. 3B, and FIG. 3C).

The frame member 6a is manufactured, as shown in FIG. 3A, by adhering a film made of a photocurable resin material on the protective film 8 on the piezoelectric substrate 1, then performing exposure and development to remove predetermined portions. Note that, the photocurable resin material contains an acid generating material. The film is removed so that the portion corresponding to the region for forming the SAW element 2 has an opening. Namely, the frame member 6a is formed so as to surround the SAW element 2 in a plan view.

Further, the frame member 6a is provided with electrode formation-use through holes 21. The electrode formation-use through holes 21 are formed by removing portions located in regions right above the outside connection-use conductors 3 in the film which forms the frame member 6a. The top surfaces of the outside connection-use conductors 3 are exposed by this.

After forming the frame member 6a, as shown in FIG. 3B, the lid member 6b closing the opening surface of the frame member 6a is formed. For manufacturing the lid member 6b, a film which forms the lid member 6b is adhered to the top surface of the frame member 6a, then heated to thereby to bond the two to each other. The heating conditions are suitably determined in accordance with the material etc. of the two. Note that, in case an epoxy-based resin is used as the material of the frame member 6a and the lid member 6b, heat-bonding is preferably carried out within a range from 100° C. to 200° C. Thus polymerization of the epoxy resin is promoted, and the contact strength and the tight seal are improved more.

After that, by applying the exposure and development to the film forming the lid member 6b and removing the portions corresponding to the electrode formation-use through holes 21 etc., the protective cover 6 configured by bonding the frame member 6a and the lid member 6b is formed. Further, by providing the lid member 6b, a space surrounded by the frame member 6a, the lid member 6b, and the top surface of the piezoelectric substrate 1 is formed. That space becomes the vibration space of the SAW element 2.

In case the material of the film forming the lid member 6b is comprised of a photocurable resin containing an acid generating material containing fluorine, as explained above, preferably the lid member 6b is provided with through holes 14. The through holes 14 are formed simultaneously with the electrode formation-use through holes 21 by performing the exposure and development at positions where the through holes 14 are to be formed in the process of removing portions corresponding to the electrode formation-use through holes 21. Note that, in case the through holes 14 are provided, as shown in FIG. 3C, a sealing resin 11 closing the through holes 14 and having opening portions corresponding to the electrode formation-use through holes 21 is provided, and the vibration space 7 is tightly sealed by this. If air bubbles are mixed into the sealing resin 11, the structure including the protective cover 6 cannot be stably sealed. Therefore, preferably the sealing resin 11 is formed by a vacuum printing method from the viewpoint of preventing mixing of air bubbles.

In case the lid member 6b is formed by using a film, by forming the frame member 6a so that the outer circumferential end surface of the frame member 6a is located on the same plane as the outer circumferential end surface of the piezoelectric substrate 1, strain of the lid member 6b can be suppressed when using a piezoelectric wafer to obtain multiple SAW devices. This principle will be explained based on FIG. 4.

FIG. 4A is a view showing the middle stage in case using a base substrate for obtaining multiple devices, that is, a piezoelectric wafer 1', to prepare SAW devices according to the present embodiment and shows a state where a second layer (film 6b') which forms the lid member 6b is placed on the frame member 6a which forms the first layer. FIG. 4B is a view showing the middle stage in case using a piezoelectric wafer 1' for obtaining multiple devices to prepare SAW devices of a comparative example. Note that, a "substrate region" in the drawings is a region corresponding to one SAW device, and a "discard region" is a region which is discarded when cutting the piezoelectric wafer 1'. The boundaries between the substrate regions and the discard regions substantially coincide with the outer circumferential edges of the piezoelectric substrates 1.

As shown in FIG. 4B, in the case of the structure of the SAW device of the comparative example, the frame member 6a is located at inner side from the outside connection-use electrodes 3, therefore the outer circumferential end surface of the frame member 6a is located much further inward than the outer circumferential end surface of the piezoelectric substrate 1. Accordingly, a distance X2 between frame members 6a formed in adjacent substrate regions becomes large. When a film 6b' which forms the lid member 6b is placed on the frame members 6a in such a state, the film 6b' easily flexes in the regions between adjacent frame members 6a. If the film 6b' flexes, the portions of the film 6b' located above the openings of the frame members 6a become arc shaped, so non-contact portions are easily formed between the frame members 6a and the film 6b' thereby inviting a drop in the tight seal of the vibration spaces 7.

Contrary to this, if, as shown in FIG. 4A, locating the outer circumferential end surface of the frame member 6a on the same plane as the outer circumferential end surface of the piezoelectric substrate 1, the distance X1 between adjacent frame members 6a can be made small. In this case, occurrence of flexure in the film 6b' in the regions between adjacent frame members 6a can be suppressed. Thus flatness of the film 6b' is maintained, the tight contact between the frame members 6a and the film 6b' becomes good, and the seal of the vibration spaces 7 can be kept high. More preferably, adjacent frame members 6a are connected to each other at least at the stage of placing the film 6b'. Thus flexure in the film 6b' can be smaller. In this case, in the process of removing unnecessary portions of the film forming the lid members 6b, the connection portions of adjacent frame members 6a are also removed.

Step C

Figure 5A:
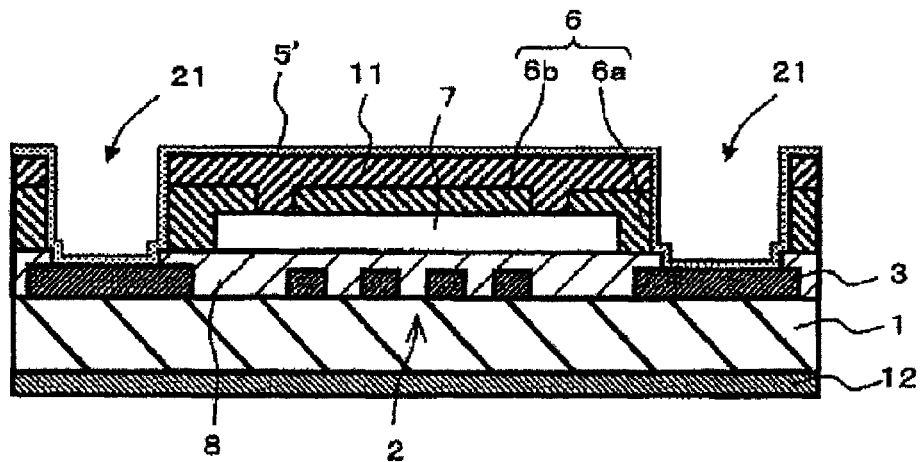
FIG. 5 Views schematically showing an example of a production method of the SAW device shown in FIG. 1.
Figure 5B:
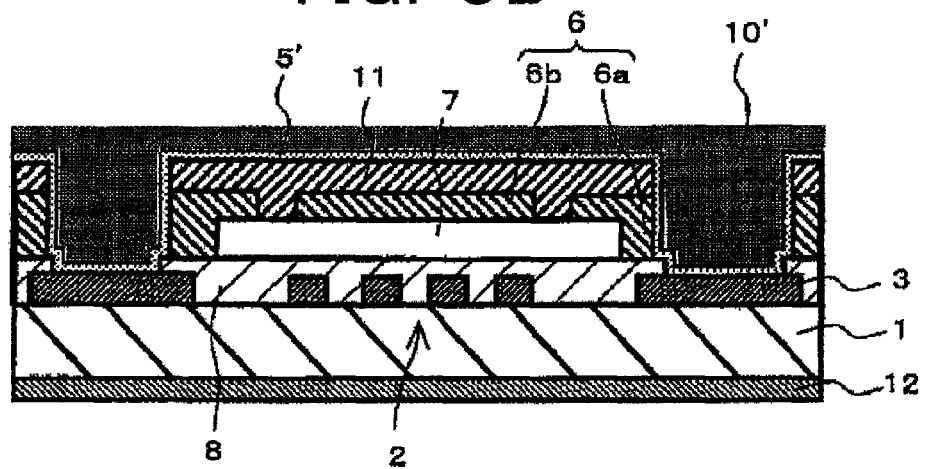
Figure 5C:
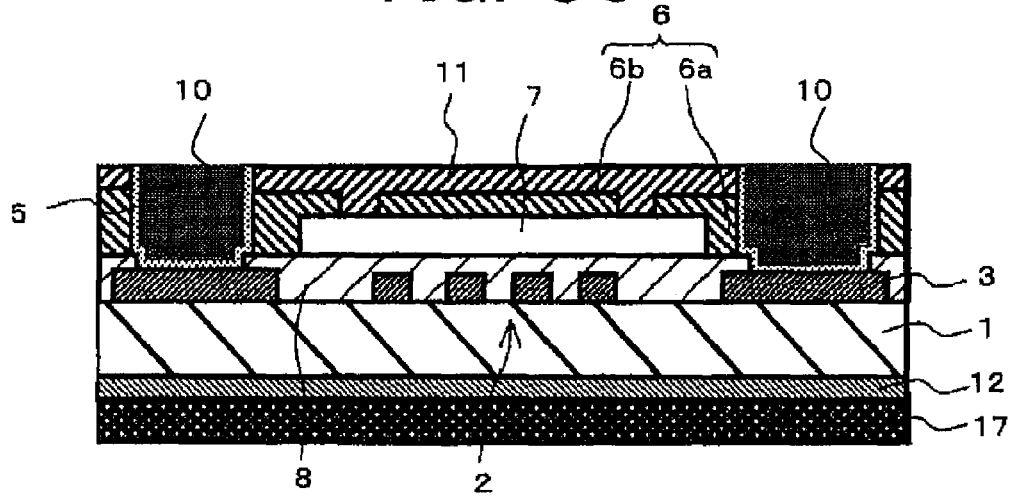

Next, columnar electrodes 10 are formed in the electrode formation-use through holes 21 (see FIGS. 5A to 5C).

First, as shown in FIG. 5A, a plating base layer 5' covering the entire top surface of the piezoelectric substrate 1 is formed. The plating base layer 5' is a metal layer partially used as the electrode formation base layer 5 in a later step. One preferred example of the plating base layer 5' is formed by, for example, Ti—Cu alloy or the like by flash plating. In case the plating base layer 5' is formed by flash plating, it is not necessary to form an line pattern for making current flow in a plating forming portion. This is beneficial for reducing the size of a SAW device.

Note that, in case the plating base layer 5' is formed on the entire top surface of the piezoelectric substrate 1 including the protective cover 6, the plating base layer 5' only have to be formed to an extent such that the columnar portions 10 of the outside connection-use electrodes can be reliably formed on at least the portion forming the electrode formation base layer 5.

After forming the plating base layer 5', as shown in FIG. 5B, an electrode layer 10' is formed in the region in which the plating base layer 5' is formed. The electrode layer 10' becomes the columnar electrodes 10 in the later step. The electrode layer 10' can be formed by electroplating, electroless plating, the stud bump method, or the like. Among these, formation by electroplating is preferred. Electroplating is a technique with a fast growth speed and easy formation of a thick film, therefore the degree of freedom of the heights of the columnar electrodes 10 can be raised. In particular, the thickness of plating depends upon the plating time. Therefore, when forming a layer having a thickness exceeding 30 μm, electroplating with its fast growth speed is preferred. As the material for forming the electrode layer 10', for example, use can be made of conductive material such as solder, Cu, Au, Ni or the like.

Next, as shown in FIG. 5C, the columnar electrodes 10 are formed by removing the top surface portion of the electrode layer 10'. As the method of removing the electrode layer 10', for example, a method of using a grinder to grind away the top surface of the electrode layer 10' until at least the top surface of the sealing resin 11 is exposed can be considered. Further, after grinding the top surface of the electrode layer 10', in order to make the connection between the later explained electrode terminals 9 and the columnar electrodes 10 better, the surface can be finished by buffing etc.

After forming the columnar electrodes 10, a back surface protection layer 17 is formed. The back surface protection layer 17 is provided for the purpose of improving the shock resistance of the SAW device at the time of production and after production. Namely, by providing the back surface protection layer 17, occurrence of failure such as breakage, cracks or the like in the SAW device is suppressed, and improvement of the manufacturing yield and improvement of the reliability are realized.

If this back surface protection layer 17 is formed from the bottom surface to the side surfaces of the piezoelectric substrate 1, not only the bottom surface of the piezoelectric substrate 1, but also its side surfaces are protected. In this case, invasion of moisture from interfaces between the piezoelectric substrate 1 and the sealing resin 11 is suppressed, and a SAW device further improved in the tight seal and humidity resistance is realized.

If the back surface protection layer 17 is formed by a material which has substantially the same coefficient of thermal expansion as that of the sealing resin layer 11, the stress due to the sealing resin layer 11 is eased, therefore warping of the piezoelectric substrate 11 due to the stress can be suppressed. In particular, if an epoxy-based resin material is used, the coefficient of thermal expansion can be controlled by adding filler such as $SiO_2$ or the like, and the moisture permeability is low and absorption property is high, therefore stress applied to the piezoelectric substrate 1 can be cancelled between the top and bottom surfaces.

Further, the back surface protection layer 17 can be formed at any timing after the formation of the back surface electrode 12. However, if it is formed after the sealing resin 11 is formed on the top surface of the piezoelectric substrate 1 as explained above, stress applied to the piezoelectric substrate 1 by the difference of the coefficient of thermal expansion between the piezoelectric substrate 1 and the sealing resin 11 can be cancelled, and a higher reliable SAW device can be realized, so this is preferred.

Next, electrode terminals 9 are formed on the exposed top surfaces of the columnar electrodes 10. The electrode terminals 9 may be provided as solder bumps as shown in FIG. 1A or may be provided as flat pads by forming a thin film made of a conductive material. In the former case, the electrode terminals 9 can be formed, for example, by screen-printing a solder paste made of PbSn solder, lead-free solder, AuSn solder, AuGe solder or the like on the upper portion of the columnar electrodes 10 and reflowing it.

By the steps described above, the SAW device according to the present embodiment can be produced. In addition, these steps can be realized in a so-called wafer process. The steps explained above can be simultaneously carried out for many SAW devices on a base substrate forming the piezoelectric substrates 1 by later dicing. Namely, a SAW device can be provided without complex treatment in latter steps. Further, by providing the protective cover on the piezoelectric substrate 1, a ceramic package etc. for housing the SAW device becomes unnecessary, so a small-sized SAW device can be provided.

Other Embodiments

Next, SAW devices according to other embodiments of the present invention are explained (FIG. 6, FIGS. 7A to 7C, and FIG. 8).

Figure 6:
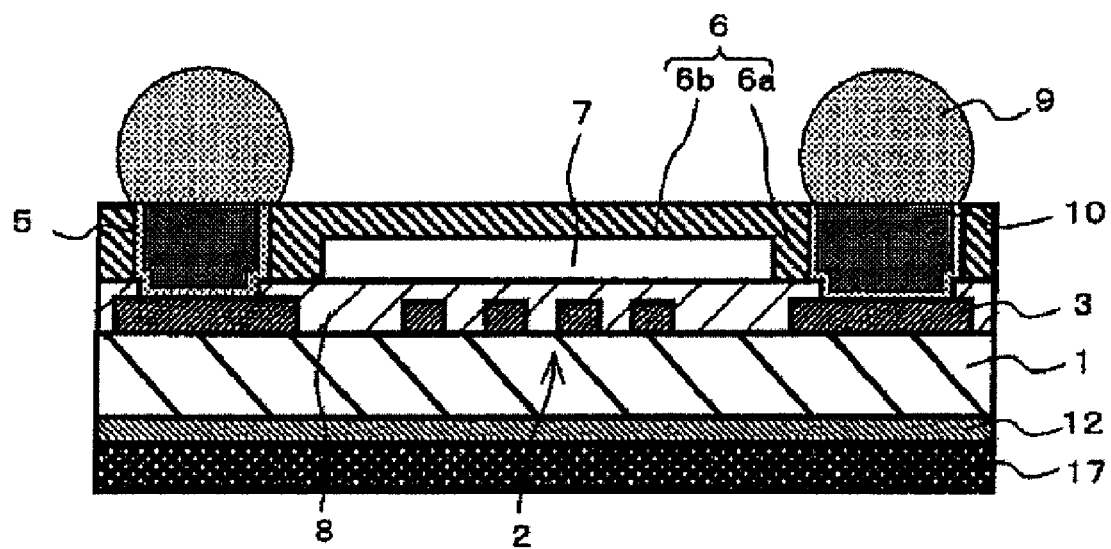
FIG. 6 A view showing a SAW device according to another embodiment of the present invention.

FIG. 6 is a cross-sectional view showing a SAW device according to another embodiment of the present invention. In the SAW device shown in FIGS. 1A and 1B, the structure of providing the through holes 14 and providing the sealing resin 11 closing the through holes 14 was explained. However, as shown in FIG. 6, a structure providing neither the through holes 14 nor the sealing resin 11 may be employed as well. In the case of the SAW device shown in FIG. 6, the height is lowered by the amount resulting from provision of no sealing resin 11, so the SAW device can be made further smaller in size. Further, there is also the advantage that peeling of the protective cover 6 due to the stress caused by the difference of the coefficient of thermal expansion between the sealing resin 11 and the protective cover 6 becomes small. Further, the process of manufacturing the sealing resin 11 can be omitted, therefore the productivity of the SAW device can be improved as well.

Figure 7A:
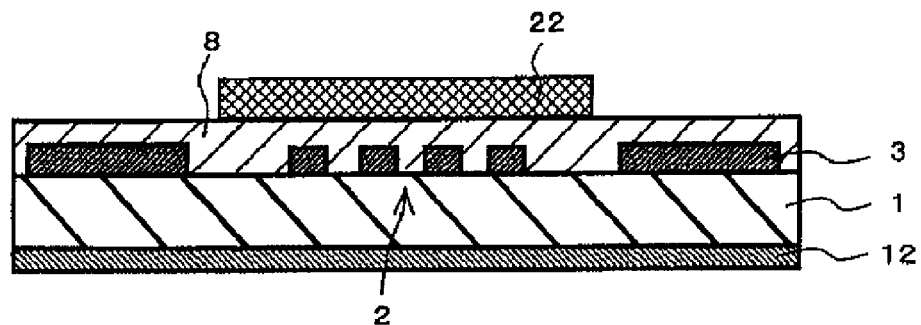
FIG. 7 Views showing another example of the production method of the SAW device shown in FIG. 1.
Figure 7B:
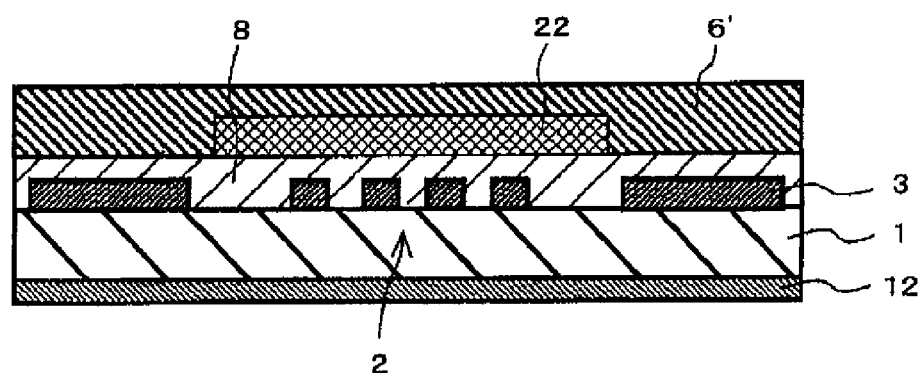
Figure 7C:
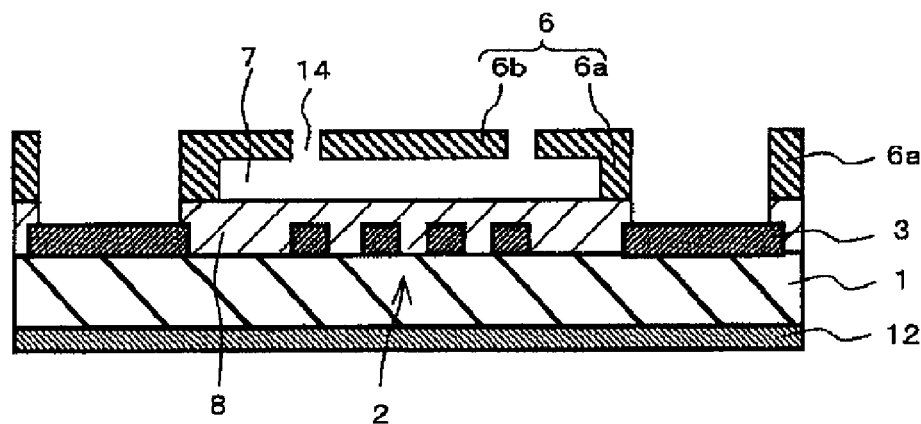

FIGS. 7A to 7C are views showing the process of forming the vibration space 7 by a method different from the method of production of the SAW device explained above. In the method of production explained above, the vibration space 7 was formed by providing the frame member 6a surrounding the SAW element 2 and placing the film closing the opening of the frame member 6a on the frame member 6a. In the method of production shown in FIG. 7, the vibration space 7 is formed by using a sacrificial layer 22. For forming the vibration space 7 by using the sacrificial layer 22, first, as shown in FIG. 7A, the sacrificial layer 22 is formed after the protective film 8 is formed on the piezoelectric substrate 1 having the SAW element 2 and outside connection-use conductors 3 formed thereon. The sacrificial layer 22 is a layer which is once formed, but is removed by treatment such as etching, dissolving or the like in a later step. The sacrificial layer 22 can be formed by, for example, a silicon oxide such as silicon dioxide or the like, amorphous silicon, a photoresist, or polymer material and so on. Here, an explanation is given of a case of forming the sacrificial layer 22 by silicon dioxide. In such a case, the sacrificial layer 22 can be formed by a method of formation by plasma CVD using starting material gas such as TEOS (tetraethyl orthosilicate), TEB (tetraethyl borate), TMOP (tetramethyl oxyphosphate) or the like, or a method using a vacuum process such as sputtering or the like, or another method.

It is also possible to utilize the photosensitivity of polysilane to form the sacrificial layer 22. Polysilane is a silicon-based polymer in which silicon (Si) atoms are connected in a chain state. By irradiating this with UV rays, the —Si—Si— bonds are decomposed by the light, so siloxane bonding portions in which oxygen atoms are arranged between silicon bonds or silanol groups acting as acid sites are formed. When immersing this in an alkali developer, the portions at which silanol groups are formed dissolve in the developer. Namely, by selectively forming the parts exposed by the UV rays, it is possible to remove only the exposed portions by dissolution and therefore possible to form any planar shape. After development, by irradiating UV rays having a sufficient strength again to expose the entire surface, then heating it in an oxygen atmosphere again, oxygen atoms enter into portions in which silicon bonds are cut due to reaction with the UV rays, whereby a silicon oxide film is formed. Note that, as modifying groups modified in the side chain of the polysilane, a variety of groups such as propyl groups, hexyl groups, phenylmethyl groups, trifluoropropyl groups, nonafluorohexyl groups, tolyl groups, biphenyl groups, phenyl groups, cyclohexyl groups or the like can be appropriately selected.

Further, in the case of forming the sacrificial layer 22 by amorphous silicon, it is possible to form this by a method of formation by plasma CVD using starting material gas such as $H_2$, $SiH_4$ or the like, a method using vacuum process such as sputtering or the like, or other method.

After forming the sacrificial layer 22, a protective cover-use resist layer 6' covering the sacrificial layer 22 is formed as shown in FIG. 7B by using negative type photosensitive resist such as an epoxy-based resin, polyimide resin, BCB (benzocyclobutene), an acrylic resin or the like by spin coating or other technique.

Next, as shown in FIG. 7C, by performing the exposure and development on the protective cover-use resist layer 6', predetermined portions of the protective cover-use resist layer 6' are removed to thereby form the protective cover 6. At this time, the through holes 14 are provided in the lid member 6b. Then, by removing the sacrificial layer 22 via the through holes 14, the vibration space 7 is formed.

As the method of removing the sacrificial layer 22 via the through holes 14, in case forming the sacrificial layer 22 by amorphous silicon, the technique of selective etching by dry etching or wet etching can be applied. For example, the sacrificial layer 22 can be removed by dry etching using $XeF_2$ (xenon fluoride gas), wet etching using fluoro-nitric acid, or the like. Further, when forming the sacrificial layer 22 by silicon dioxide, a technique such as dry etching by fluoric acid vapor, wet etching by immersion in a buffer fluoric acid or the like can be utilized.

After formation of the vibration space 7 by removing the sacrificial layer 22, the SAW device as shown in FIG. 1 can be prepared by passing through the same steps as those of the embodiment explained above.

Figure 8:
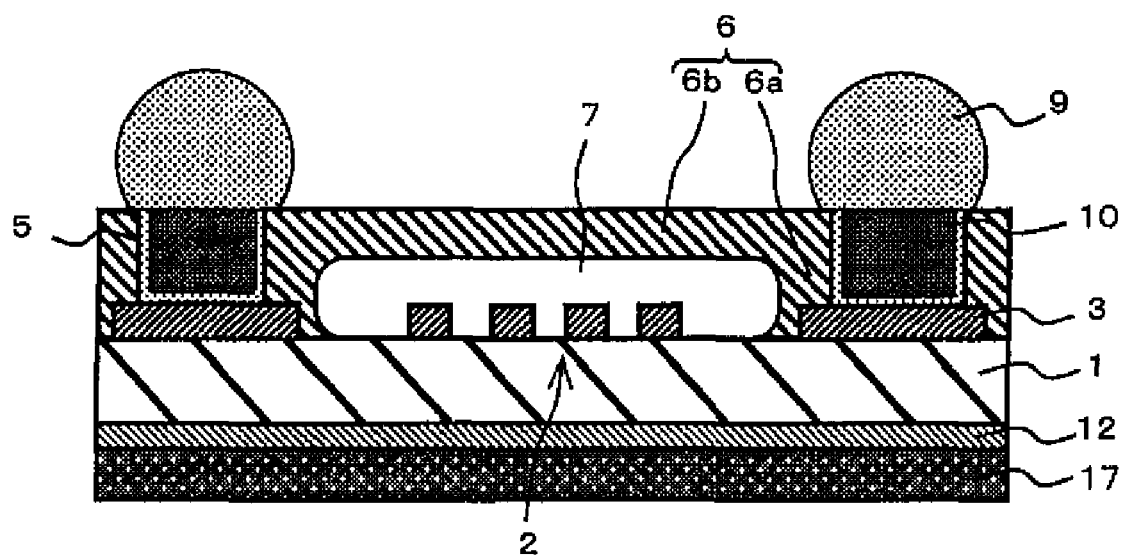
FIG. 8 A view showing a SAW device according to still another embodiment of the present invention.
Figure 9:
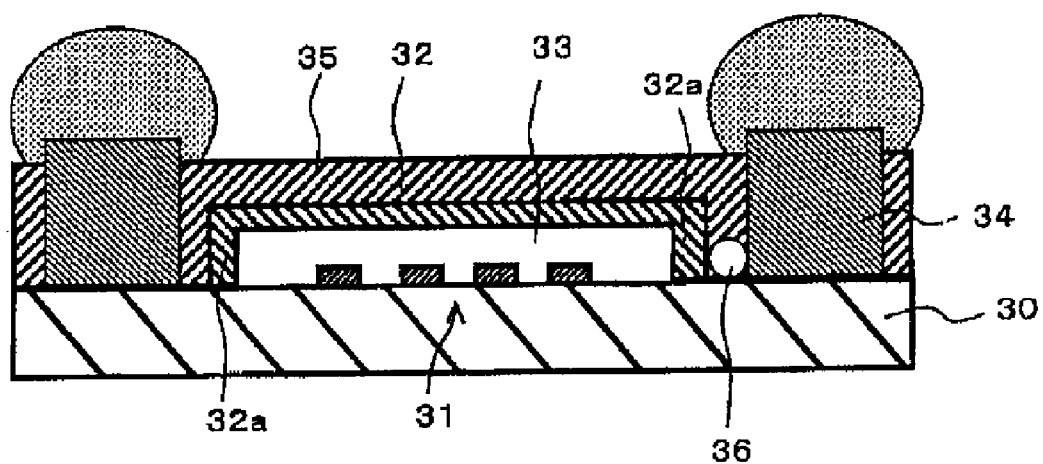
FIG. 9 A cross-sectional view schematically showing a SAW device.

FIG. 8 is a cross-sectional view showing still another embodiment of the SAW device. The SAW device shown in FIG. 8 has a structure in which the protective film 8 is omitted from the SAW device shown in FIG. 6. Note that, the SAW device shown in FIG. 8 may have a structure in which the protective film 8 is omitted from the SAW device shown in FIG. 1 as well. In the SAW device shown in FIG. 8, the protective film 8 is omitted, therefore the structure and production processes are simplified. Note that, the frame member 6a directly contacts the connection conductors 3, therefore the material of the frame member 6a is preferably made one having good adhesion with respect to the connection conductors 3. As such a material, for example, a resin cured by radical polymerization of acryl groups, methacryl groups or the like, more specifically, a urethane acrylate-based, polyester acrylate-based, or epoxy acrylate-based resin can be exemplified.

Note that, the present invention may be applied to not only a SAW device, but also other acoustic wave device such as a thin film bulk acoustic resonator or the like.

The invention claimed is:

1. An acoustic wave device comprising:
a substrate;
an acoustic wave element on one main surface of the substrate;
an outside connection-use conductor on the one main surface of the substrate, electrically connected to the acoustic wave element;
a columnar electrode on the outside connection-use conductor; and
a protective cover defining inner walls of a vibration space for vibration of the acoustic wave element and planarly surrounding a side surface of the columnar electrode, wherein
the protective cover comprises a frame member defining side walls of the vibration space and a lid member defining a ceiling of the vibration space, and
in a vertical cross-section of the vibration space, a corner portion on the lid member side and a corner portion on the piezoelectric substrate side are rounded.

2. The acoustic wave device corresponding claim 1, wherein the protective cover comprises a frame member defining side walls of the vibration space and a lid member defining a ceiling of the vibration space.

3. The acoustic wave device corresponding claim 2, wherein the frame member planarly surrounds the side surface of the columnar electrode.

4. An acoustic wave device comprising, a substrate;
an acoustic wave element on one main surface of the substrate;
an outside connection-use conductor on the one main surface of the substrate, electrically connected to the acoustic wave element;
a columnar electrode on the outside connection-use conductor; and
a protective cover defining inner walls of a vibration space for vibration of the acoustic wave element and planarly surrounding a side surface of the columnar electrode, wherein
the protective cover comprises a frame member defining side walls of the vibration space and a lid member defining a ceiling of the vibration space, and
in a vertical cross-section of the vibration space, a corner portion on the lid member side and a corner portion on the piezoelectric substrate side are rounded
the frame member planarly surrounds the side surface of the columnar electrode,
the lid member has a through hole penetrating through the lid member in a thickness direction, and
a sealing resin filled in the through hole and defines a portion of the ceiling of the vibration space at the filled portion is further provided.

5. The acoustic wave device corresponding claim 4, wherein the sealing resin planarly surrounds the side surface of the columnar electrode.

6. The acoustic wave device corresponding claim 1, further comprising as protective film covering the acoustic wave element.

7. The acoustic wave device corresponding claim 6, wherein the protective film is interposed between the protective cover and the connection-use conductor.

8. The acoustic wave device corresponding claim 1, wherein an outer circumferential edge of the substrate and an outer circumferential edge of the frame member planarly coincide.

9. The acoustic wave device corresponding claim 1, wherein the vibration space forms a substantially box shape, and its corner portions are rounded.

* * * * *